US007203880B2

(12) United States Patent
Chakravarthy et al.

(10) Patent No.: US 7,203,880 B2
(45) Date of Patent: Apr. 10, 2007

(54) GENERATING AN ABBREVIATED NETLIST INCLUDING PSEUDOPIN INPUTS AND OUTPUT NODES

(75) Inventors: Srinivasa Chakravarthy, Bangalore (IN); Rubin A. Parekhji, Bangalore (IN); Julio C. Hernandez, Rancho Santa Margarita, CA (US); Kenneth M. Butler, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/771,775

(22) Filed: Feb. 2, 2004

(65) Prior Publication Data

US 2004/0158789 A1    Aug. 12, 2004

Related U.S. Application Data

(62) Division of application No. 09/681,598, filed on May 4, 2001, now Pat. No. 6,697,982.

(51) Int. Cl.
*G01R 31/28* (2006.01)
*G01R 31/3183* (2006.01)
*G06F 11/00* (2006.01)

(52) U.S. Cl. .................................. 714/738

(58) Field of Classification Search ........ 714/726–729, 714/738; 326/16; 716/4
See application file for complete search history.

(56) References Cited

U.S. PATENT DOCUMENTS 5,903,578 A * 5/1999 De et al. ................. 714/726
6,223,315 B1 * 4/2001 Whetsel .................. 714/727

* cited by examiner

*Primary Examiner*—Shelly Chase
(74) *Attorney, Agent, or Firm*—Lawrence J. Bassuk; W. James Brady; Frederick J. Telecky, Jr.

(57) ABSTRACT

A method generates test vectors for a customer designed integrated circuit having an embedded vendor circuit. The embedded vendor circuit has a proprietary circuit and a nonproprietary circuit. At least one pseudo input is defined to represent a portion of the nonproprietary circuit to emulate the nonproprietary circuit output. An output node of the embedded vendor circuit to which an input of the customer designed circuit is connectable is identified. A test netlist is created which represents circuitry that produces output states at the output node which would be generated by the embedded vendor circuit thereat. The test netlist includes at least one pseudo input and the output node, without including a full netlist of either the proprietary or nonproprietary circuits, and can be used to generate scan test vectors for the customer designed integrated circuit by the automatic test vector generating software program.

2 Claims, 3 Drawing Sheets

GENERATING AN ABBREVIATED NETLIST INCLUDING PSEUDOPIN INPUTS AND OUTPUT NODES

This application is a divisional of application Ser. No. 09/681,598 filed May 4, 2001, now U.S. Pat. No. 6,697,982.

COPYRIGHT STATEMENT

A portion of the disclosure of this patent document contains material which is subject to copyright or mask work protection. The copyright or mask work owner has no objection to the facsimile reproduction by anyone of the patent document or the patent disclosure, as it appears in the Patent and Trademark Office patent file or records, but otherwise reserves all copyright or mask work rights whatsoever

BACKGROUND OF INVENTION

1. Field of Invention

This invention relates to improvements in testing integrated circuits, in general, and to improvements in methods for testing embedded core integrated circuits while preserving the intellectual property contained in the core circuits, that is, protecting the core circuits from being discovered or determined by inspection of the testing software, in which virtual or pseudo pins are used to represent at least a portion of the core circuits to the testing software.

2. Relevant Background

Recently, embedded integrated circuit cores have been increasingly popular. An embedded circuit core is an integrated circuit building block or module that is embedded into a system chip. Examples of such embedded cores include customizable digital signal processors (cDSPs), which may be embedded into a system that is integrated onto a single integrated circuit chip. The DSP may be of a proprietary design, and the peripheral and supporting circuitry may be customized for a particular use or customer.

Presently, some companies sell "embedded core" or circuit designs for use by customers who wish to design their own custom circuit content to produce their own customized or application specific integrated circuits (ASICs). As an example, a customer may wish to design its own peripheral circuits for use with a particular DSP core. In practice, the designer of the DSP provides a circuit description of the DSP in a format that will enable the customer to fabricate his desired circuit. The DSP description, however, will ideally be only sufficient to enable the customer to fabricate the custom DSP, together with peripheral circuits of its own design onto an integrated circuit, but does not disclose the specific design and circuitry of the embedded DSP. A chip in which the embedded core is included is sometimes referred to as a system on chip (SOC).

However, using this chip manufacturing technique gives rise to several problems. For example, from a business standpoint, to make the design of a core circuit economically feasible, the design often needs to be reusable in many diverse customer circuit designs. However, the delivery of a complete circuit design to a customer often enables the customer to reverse engineer the circuit, enabling the circuit configuration, and other aspects of the circuit, to be discovered. The customer then has the ability to reproduce the circuit at will, thereby shortening the lifetime during which the core designer can recoup its design and engineering costs. Therefore, unless steps are taken to protect against reverse engineering the core, the value of the intellectual property in the core may be compromised. Such embedded cores in which the owner has one or more intellectual property interests have recently been referred to as "IP cores".

Therefore, when an embedded IP core is delivered to a customer, details of construction of the core are generally not disclosed. The information that is disclosed often is just sufficient to enable the user to interface its own circuitry to the IP core. Thus, previous IP core models often were treated as "black boxes", in order to protect the IP content embodied in the models. No visibility into the internal structure or circuitry of the models was provided. Thus, for example, the core often may be delivered only as a circuit description, with only the connection pins and required signal parameters thereof being disclosed. However, this makes testing of the embedded core difficult or impossible. However, a properly designed core should be completely tested at least in a netlist version before being delivered to a customer for use with its custom designed circuitry. Thus, ideally, it should be unnecessary for the customer to repeat the core tests, except to the extent necessary to properly test the added circuitry and their interface and operation with the core.

Nevertheless, after an ASIC has been designed and manufactured, the chip should be tested for manufacturing defects. This typically involves first simulating a properly functioning ASIC, developing a variety of input test patterns and applying them to the simulated ASIC, and determining the expected outputs of the ASIC. The input test patterns are then applied to the actual ASIC. The actual outputs are then compared to the expected outputs. Deviations from the expected outputs indicate that the ASIC has a manufacturing defect.

Because of the complexity of the logic buried within the ASIC, an enormous number of test patterns may be required to properly test the integrated circuit device. One technique that has been used to test such integrated circuits is to add "scan cells" to the ASIC at strategic locations throughout the circuit. Scan cells are points at which logic values may be forced into the ASIC (scan writable gates) and/or observed within the ASIC (scan readable gates). Scan cells normally take the form of flip-flops which may be forced to desired logic values from outside the ASIC, or which may be read from outside the ASIC to determine particular behavior of the ASIC, for example after the test inputs have been applied. For instance, some scan cells enable an external tester to preset a counter within the ASIC to a particular count, and to capture values that verify that combinatorial logic derived from the counter outputs is working properly.

In general, in the design of such scan flip-flops, non-scan flip-flops are often converted into scan flip-flops by adding some additional logic gates, often including a multiplexer. The multiplexer selectively allows either the test values or the circuit values to be applied to the scan cell with which it is associated. The multiplexer is operated for example by a selection signal applied to a selected pin of the ASIC.

Strategic placement of scan cells within an ASIC allows the number of test patterns required to fully test an ASIC to be drastically reduced. Scan cells are normally connected in long chains, allowing all of the scan cells to be written or read from using only a few dedicated test I/O pins on the ASIC. This is important primarily because the computer simulations necessary to produce the test patterns and expected resulting outputs require a great deal of computer resources. Without scan cell techniques, simulation times to produce test patterns that adequately test an ASIC would be impractically long. Furthermore, without scan cells some gates within an ASIC may be simply not testable. However, using scan cells it is often possible to develop test patterns that will detect 99% or more of possible gate failures using a set of test patterns that is not impractically long. The fault coverage obtained is the percentage of possible gate failures that will be detected by a given set of test patterns.

Nevertheless, ASIC designs using embedded cores present a challenge to test. To assist the custom designers, embedded cores typically are supplied by the vendor along with a set of test patterns, which, if applied in isolation, will produce 99% fault coverage. However, these patterns cannot usually be applied to the embedded core in isolation, because the core is buried inside the ASIC with no direct access to the core's primary inputs and primary outputs. Hence, it is not possible to apply the supplied set of test patterns to the core in isolation unless some mechanism is supplied for accessing the core.

Among the isolation schemes that have been proposed are the use of multiplexed isolation, boundary scan cells wrapped around the core, and core parallel module testing, which includes the use of multiplexers to allow direct access to the circuitry in question. All of these proposed techniques result in area and performance overhead, which may make these techniques unacceptable for many applications.

A second possible type of approach is to generate new test vectors which will be applied at the ASIC level. Test pattern generation software is well known in the art, and is usually provided by third party vendors. Although it is possible for the ASIC vendor to generate a complete set of test vectors to test the customer's ASIC, many customers demand that third party vendors be capable of taking the customer's ASIC design and generating test vectors for it, without requiring any further assistance from the vendor.

The input to a test pattern generation program is typically a flattened ASIC netlist. A netlist is a list of circuit elements and their interconnections, and may be manually generated, or may be generated by known software programs for use in other software programs. Of course in a circuit as complex as a DSP, it would be impractical or impossible to manually generate a useful netlist.

The flattened netlist describes the complete ASIC in terms of primitives such as AND and OR gates, and their functional interconnections. The netlist is described as flattened because the cores, which are hierarchical functional blocks, have been reduced to their constituent primitives and interconnections. Using the flattened netlist, the test pattern generation software is able to generate test patterns that will test the ASIC with an extremely high percentage of fault coverage.

The problem with which a present invention is concerned is that of supplying a flattened netlist to the customer from which the third party's test pattern generator software can generate test patterns to test the entire ASIC, conflicts with the goal of keeping the detailed design of cores confidential. The flattened netlist for the core comprises much of the proprietary design details that the ASIC vendor desires to keep confidential.

Furthermore, in many circuit designs a large quantity of nonproprietary circuitry may be used. In DSP designs, for example, IEEE standard 1149.1 is often followed in the provision of testing circuitry, referred to as boundary scan or "JTAG" circuitry. To access the JTAG circuitry, a JTAG Interface circuit is provided, which also accesses the scan chains that are provided in the core. The modeling of the JTAG circuitry is non-trivial.

What is needed, therefore, is a method for enabling a core user to test the core, together with its own added circuitry, without compromising the intellectual property contained in the core, and in particular without unduly complicating the scan model due to the presence of required additional test circuitry, or the like.

SUMMARY OF INVENTION

In light of the above, therefore, it is an object of the invention to provide a method for enabling a core user to test the core, together with its own added circuitry, without compromising the intellectual property contained in the core.

Intellectual Property (IP) cores lend themselves to easy integration, but not to test. This poses several test challenges in core based/core dominated systems. The methods provided by the present invention allow for the proper use of insertion of test circuitry and automatic test pattern generation (ATPG) tools, when used in the context of core based, or core dominated, digital circuit designs. This leads to significant fault coverage improvements, while at the same time, maintaining protection of the proprietary IP core.

According to a broad aspect of the invention, a method is presented for enabling scan test vectors to be generated by an automatic test vector generating software program for a customer designed integrated circuit having an embedded vendor circuit. The embedded vendor circuit has a proprietary circuit and a nonproprietary circuit. The method includes creating at least one pseudo input to represent at least a portion of the nonproprietary circuit that is not necessary to be exercised by the automatic test vector generating software program to generate test vectors for the customer designed integrated circuit. An output node of the embedded vendor circuit to which an input of the customer designed circuit is connectable is identified. A test netlist is created which represents circuitry that produces output states at the output node which would be generated by the embedded vendor circuit thereat. The test netlist includes at least one pseudo input and the output node, without including a full netlist of either the proprietary or nonproprietary circuits. Thus, scan test vectors for the customer designed integrated circuit can be generated by the automatic test vector generating software program using the test netlist with the output node connected to an input of a netlist representing the customer supplied circuitry.

According to another broad aspect of the invention, a method is presented for generating test vectors to test an integrated circuit having an embedded vendor circuit and customer supplied circuitry. The embedded vendor circuit includes a proprietary circuit and a nonproprietary circuit. At least one pseudo input is created to represent at least a portion of the nonproprietary circuit that is not necessary to be exercised by an automatic test vector generating software program to generate test vectors at least for the customer supplied circuitry. An output node of the embedded vendor circuit to which an input of the customer supplied circuitry is connectable is defined. A test netlist is created which represents circuitry that produces output states at the output node which would be generated by the embedded vendor circuit thereat. The test netlist includes the at least one pseudo input and the output node, without including a full netlist of either the proprietary or nonproprietary circuits. A netlist of the customer supplied circuitry is combined with the test netlist to form a total netlist. And an automatic test vector generating software program is applied to the total netlist to generate test vectors therefor.

According to another broad aspect of the invention, a system is presented for generating a test netlist of an embedded vendor circuit which includes a proprietary circuit and a nonproprietary circuit for use by a customer in adding thereto customer supplied circuitry. The system includes means for creating a test netlist which represents circuitry having at least one pseudo input to represent at least a portion of the nonproprietary circuit that is not necessary to be exercised by an automatic test vector generating software program. When a netlist for the customer supplied circuitry is combined with the test netlist, scan test vectors at least for the customer supplied circuitry can be generated by an automatic test vector generating software program.

BRIEF DESCRIPTION OF DRAWINGS

The invention is illustrated in the accompanying drawings, in which.

In the various figures of the drawing, like reference numerals are used to denote like or similar parts.

DETAILED DESCRIPTION

Figure 1:
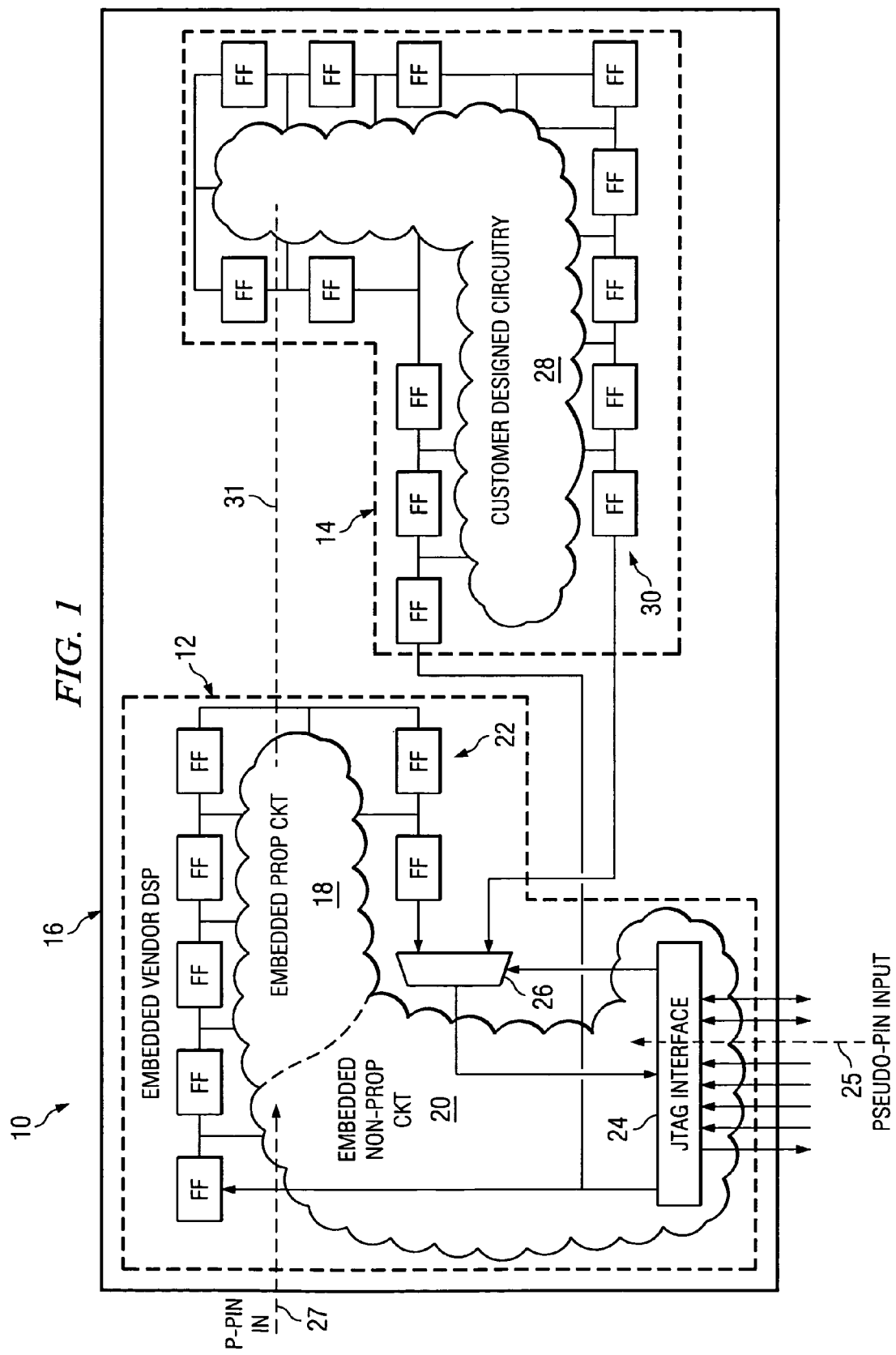
FIG. 1 is a block diagram of a circuit illustrating one environment in which the invention may be practiced.

The method proposed by the present invention addresses the problem of testing integrated Intellectual Property (IP) cores through the proper use of insertion of test circuitry and automatic test pattern generation (ATPG) tools, when used in the context of core based, or core dominated, digital circuit designs. This leads to significant fault coverage improvements, while at the same time, maintaining protection of the proprietary IP core. One technique by which this may be achieved is as follows.

An internal scan chain only, partial netlist version of the embedded core in question is first extracted or developed, including only the key input and output logic cones associated with the scan flip-flops which are fed from primary inputs, and including the scan flip-flops which are driving primary output ports or pins of the core extracted. This applies as well to cores without any direct boundary scan implementations. This task may be wholly or partially performed using known software.

Next, the cells of the netlist are renamed using a generic notation, to eliminate any remnants of functionality to assist in further removing the possibility for reverse engineering of the specific contents of the embedded core.

Test pattern creation/generation is then performed, first by replacing the existing core with its partial netlist version equivalent (the scan only "model") in the netlist hierarchy of the design. Additionally required top level input pins are introduced for proper scan mode control of the scan only model. The automatic test pattern generation (ATPG) software is then run, taking advantage of the core visibility available through the scan only model and the added test control it provides. The corresponding appropriate format test pattern files are then generated, and the test pattern files are edited to remove the additional scan only model inputs.

According to an alternative embodiment of the invention that is used exclusively with respect to ATPG a "Reset or Fixed State" only ATPG model of the embedded core is used. This technique is relatively similar to the above, except the focus is not so much IP protection, but rather the controllability of the embedded core output signal. This technique is particularly useful when support for the scan only model (partial netlist) extraction is not available for a particular embedded core.

According to the alternative embodiment, there is no extraction of any kind from the actual core netlist other than determining the state of the outputs of the embedded core at a know "Reset" or specific "Fixed" state; therefore, no IF issues are involved. However, the alternative technique provides a much less desired level of controllability than the "scan only model/partial netlist" approach. The alternative embodiment does, however, provide significant improvement over using just the embedded core in a "black box" context.

The alternative technique first determines the state of the outputs of the embedded core at a known "reset" or specific "fixed" state through simulation or some other available means, such as device specific documentation. From this information, an ATPG model representing this derived "fixed" state of the embedded core is constructed. Along with this model, just like in the "Scan Only Model" case, a corresponding ATPG setup sequence, using only the actual top level pins of the design, (i.e.: no pseudo pins needed) may be derived as well. The test pattern creation/generation is then performed by running the ATPG software on the overall embedded core based design using the newly derived ATPG model and test setup sequence. Generate corresponding appropriate format test pattern files are generated. Since, the design netlist is not changed the resulting pattern files are ready for use as is, without requiring post ATPG editing.

More particularly, FastScan.™. is one popular automatic test pattern generation (ATPG) program that is available from Mentor Graphics Corp, Wilsonville, Oreg., USA. Other programs are available as well. In operation, setup files are provided for the program, and the program automatically generates a set of test vectors that can be applied to test the circuit. The setup files contain a number of things needed for the program to run, which may include, for example, a list of initialization states that may be applied to the circuitry to produce known output results. This enables a circuit designer to append or attach his circuitry to the netlisted circuitry to accomplish his desired customized circuitry.

As described above, the netlist of the core circuitry may be a flattened or abbreviated netlist, so that the IP content of the core is not revealed to the user. However, as mentioned, much of the circuitry that will be included in the final circuit design is provided by the core vendor, but is not necessary for design verification/simulation by the custom circuit designer. An example of such additional circuitry is the JTAG Interface circuitry that may be provided with a DSP, or other similar product. Although the ATPG software may well develop appropriate test patterns for the JTAG circuitry, the test vectors are unnecessary, and, moreover, may be very complicated. As a result, and in accordance with a preferred embodiment of the invention, "pseudo-pins" are provided as a part of the setup files provided to the ATPG software.

Pseudo-pins have no circuitry associated with them, and, in fact, do not exist in the physical circuitry. They stand-in for actual circuitry pins for the ATPG software. More particularly, the pseudo-pins provide a placeholder to which the test patterns applied to the circuitry may be applied, but without the actual accompanying hardware circuitry, they do not result in the generation of a large number of test vectors by the software. Since no physical circuitry is represented by the pseudo-pins, no test vectors are generated, except those that generate the pre-established responses that may be provided in the set-up files. That is, the set-up files may contain the logic states to be applied to the pseudo-pins to produce the desired output states in the actual circuit operation. Thus, the pseudo-pins may be used to emulate the expected response by the core circuit, without including the possibly complex circuit netlist.

This is particularly useful in the case of an IP core; that is, a core that has content that is desired to be maintained in secrecy. When the set-up files are delivered to the user they may include only the initial state or setup sequences that emulate the nonproprietary circuitry that the pseudo pins replace. As a result, not only is the test vector generation greatly simplified, but the IP content of the core is maintained, as well.

Of course, once the ATPG software has generated the test vectors to test the actual physical circuitry that is represented by the netlist and other set-up files, the pseudo-pin references must be removed from the test vector files. Therefore, when the test vectors are applied to the actual circuitry in its test, the test vectors can be applied to the correct circuitry inputs. As mentioned, the test vectors for the vendor core circuitry ideally would have been already generated by the core vendor. As a result, the final combined circuitry test vectors may be somewhat redundant and unnecessary.

With reference first to FIG. 1, a block diagram of a circuit 10 is shown illustrating one environment in which the invention may be practiced. The circuit 10 includes both vendor embedded circuitry 12 and customer designed circuitry 14 that are integrated onto a single integrated circuit chip 16. In the embodiment illustrated, the vendor circuitry 12 is a digital signal processor (DSP); however, it should be understood that other circuitry may be equally advantageously employed.

The vendor embedded circuitry 12 includes both proprietary circuit portions 18 and nonproprietary circuit portions 20, which are tested in known manner by signals applied via a chain of scan flip-flops 22. The test signals normally are conducted to the chain of scan flip-flops 22 from a JTAG Interface circuit 24, and, after traversing the scan chain 22 are returned through the JTAG circuitry via a multiplexer 26 for analysis. The JTAG Interface circuit 24, for example, generates test signals according to IEEE standard 1149.1, and is shown for convenience as being included within the nonproprietary circuitry 20. The embedded vendor circuitry 12 is intended to be used by the customer as the core around which the customer desires to design its own circuitry that can take advantage of the capabilities of the core circuitry. However, in order to enable the customer to design its circuitry, sufficient details of the embedded vendor core must be provided to the customer, as described above.

The customer designed circuitry 14 includes the core of customer circuitry 28 and a chain of scan flip-flops 30. At least one output from the embedded vendor DSP 12 is applied as an input to the customer designed circuitry 14, as denoted by the dotted line 31. The customer circuitry 28 is tested by signals applied via the chain of scan flip-flops 30, separately from the test signals applied to the embedded vendor circuitry 12. The application of the test signals to the scan chain 30 of the customer circuitry 28 may also be sourced from the JTAG Interface circuit 24 and returned therethrough via the multiplexer 26.

It should be noted, however, that typically the circuitry of the JTAG Interface circuit 24 is relatively complex, and is mostly, if not entirely, nonproprietary. Moreover, in some cases the JTAG Interface circuit 24 is mostly, if not entirely, used in the testing of the embedded vendor circuitry 12, rather than the customer designed circuitry 14. As a result, the inclusion of the circuitry of the JTAG Interface circuit 24 in the netlist that is provided to the customer to enable the customer to develop its circuitry may unduly complicate the design and test of the customer designed circuitry 14, and specifically the ATPG software development of the test vectors for testing the customer circuitry 28. For example, when the ATPG software is applied to the entire circuit including both the embedded vendor DSP and customer designed circuitry 14, it must contend with the signal modifications made by the circuitry of the JTAG Interface 14. This may add significant time to the generation of the test vectors for testing the final circuits.

Therefore, according to the invention, some or all of the circuitry of the vendor core may be represented by the "pseudo pins" described above in the netlist provided to the customer to enable the customer to use the ATPG software to generate its text vectors for the customer circuitry. For example, pseudo input or pseudo pin 25 is shown providing an input to the embedded vendor DSP 12. Since the generation of the test vectors for the customer circuitry is not affected by the operation of the JTAG Interface circuitry, the pseudo pin approach greatly simplifies and shortens the test vector generation by the ATPG. An example of a test netlist that may be furnished to a customer is attached hereto as "Appendix A". Also shown is a second pseudo input or pseudo pin 27 that may be used, if desired, to emulate other portions of the non-proprietary circuit 20.

It should be noted that the supplied embedded vendor DSP core model and its accompanying JTAG interface circuitry in most cases have already been verified by the vendor at the time they are provided to the customer. Consequently, when the customer runs an ATPG program to generate the test vectors of its own circuitry, it may at least partially duplicate the testing of the previously verified embedded vendor DSP core.

After the ATPG test vectors have been generated, a removal program may be applied to the vendor supplied netlist to remove the references to the pseudo pins from the netlist. An example of such program is attached as "Appendix B".

Figure 2:
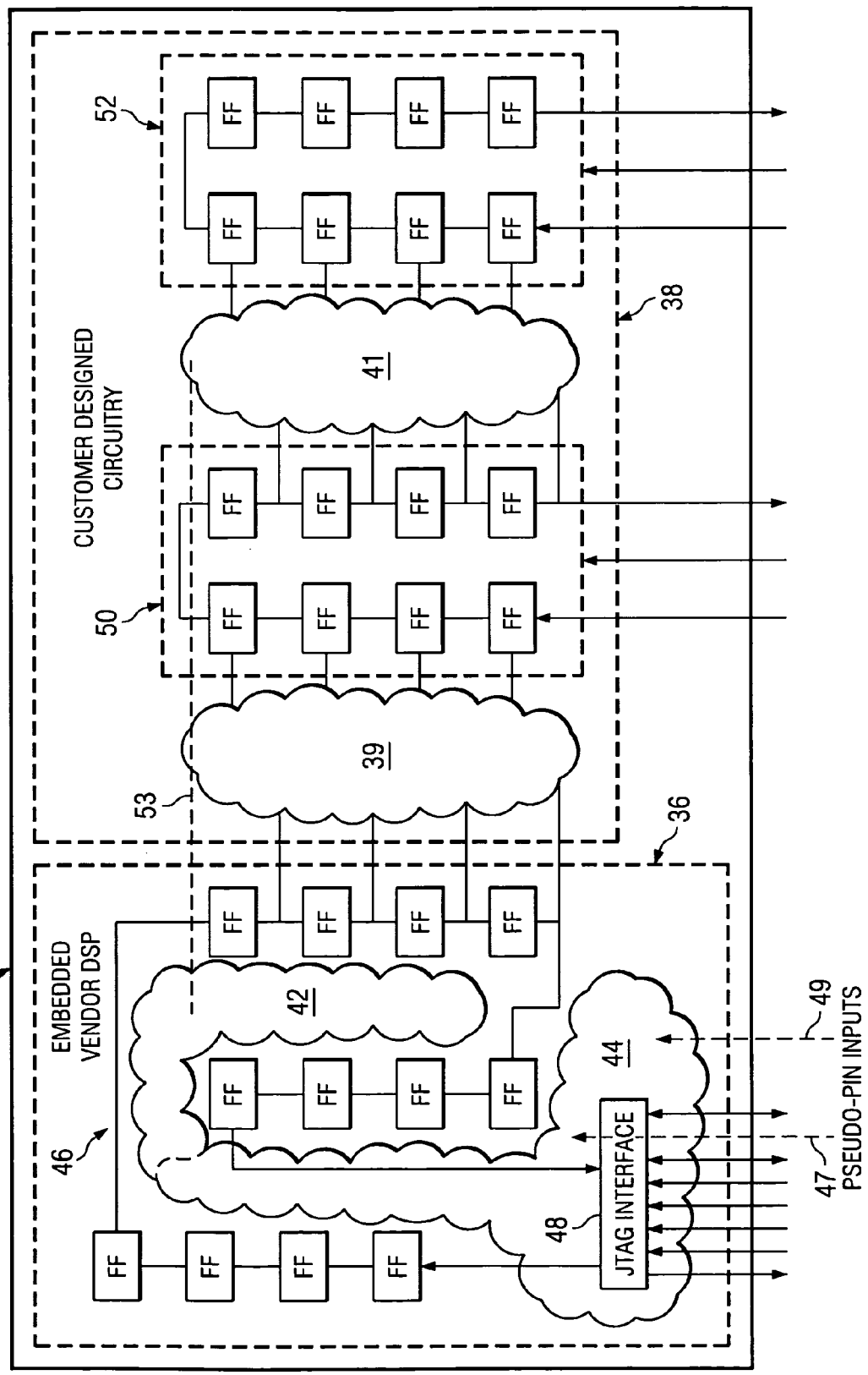
FIG. 2 is a block diagram of a circuit illustrating another environment in which the invention may be practiced.

With reference additionally now to FIG. 2, a block diagram of another circuit 35 is shown illustrating another environment in which the invention may be practiced. The circuit 35 includes both vendor embedded circuitry 36 and customer designed circuitry 38 that are integrated onto a single integrated circuit chip 40. In the embodiment illustrated, the vendor circuitry 36 again is a digital signal processor (DSP); however, it should be understood that other circuitry may be equally advantageously employed.

The vendor embedded circuitry 36 includes both proprietary circuit portions 42 and nonproprietary circuit elements 44, which are tested in known manner by signals applied via a chain of scan flip-flops 46. The test signals are conducted to the chain of scan flip-flops 46 directly from a JTAG Interface circuit 48. In some cases, the JTAG Interface circuit 48, for example, generates test signals according to IEEE standard 1149.1. In the embodiment of circuitry 35, it is clear that the JTAG Interface circuit 48 affects only the embedded vendor DSP 36, and not the customer designed circuitry 38.

The customer designed circuitry 38 includes circuitry 39 and 41, which receive outputs 43 from the embedded vendor core circuitry 36, and two or more chains of scan flip-flops 50 and 52. At least one output from the embedded vendor DSP or core 36 is applied as an input to the customer designed circuitry 39 and 41, as denoted by the dotted line 53. The customer circuitry 38 is tested by signals applied via the chains of scan flip-flops 50 and 52, separately from the test signals applied to the embedded vendor circuitry 36; however, it is noted that some of the inputs to the scan flip-flops 50 are derived from outputs from the embedded vendor DSP 36.

In the embodiment of FIG. 2, at least some of the functions of the JTAG Interface circuit 48 are emulated or replaced by one or more pseudo-pins 47, as shown. Also, if desired, other portions of the nonproprietary circuitry 44 may be emulated or replaced by pseudo-pins 49, as shown. Since the functions of the JTAG Interface circuit 48 and optionally other functions of the nonproprietary circuit 44 are emulated or replaced by the use of the pseudo pins 47 and 49 in combination with the setup states in the set up files, the pseudo-pins and setup files may be used to enable the customer to utilize the ATPG software tools to test the customer circuitry in the chip. Thus, the pseudo pin approach greatly simplifies and shortens the test vector generation by the use of such ATPG tool.

Again, after the ATPG test vectors have been generated, a removal program may be applied to the netlist to remove the references to the pseudo pins. An example of such program is attached as "Appendix B".

Figure 3:
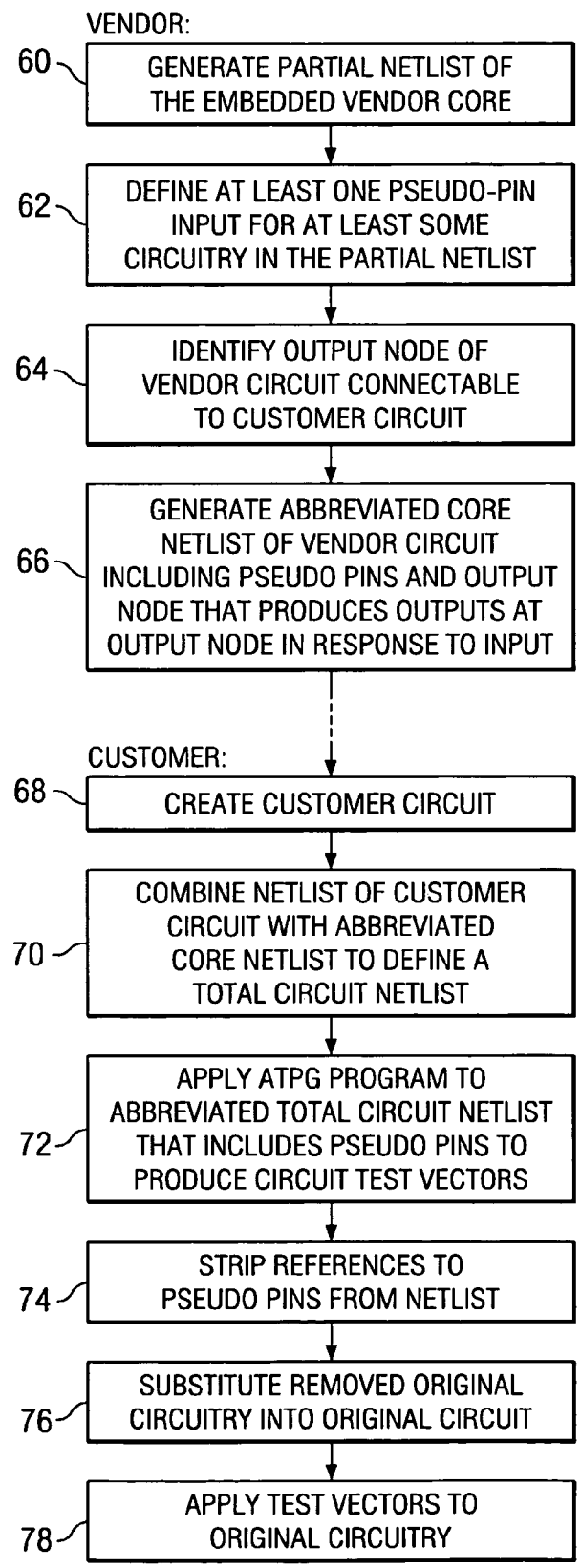
FIG. 3 is a flow chart illustrating the steps according to a preferred embodiment of the invention method for generating test vectors to test an integrated circuit having an embedded vendor circuit which includes a proprietary circuit and a nonproprietary circuit and which also includes customer supplied circuitry.

Thus, in accordance with a preferred embodiment of the invention, a method is presented for testing a circuit having both an embedded circuit core and appended user circuitry, using ATPG software to generate test vectors therefor. The steps of the method are illustrated in FIG. 3, to which reference is now made. The steps are broken up into two phases, the first performed by the vendor, the second performed by the customer. The process begins with the vendor steps, in which the vendor first generates a partial netlist of the entire embedded vendor core 60. At least one pseudo pin input is defined for at least some of the circuitry in the partial netlist 62. Also, an output node of the vendor circuit to which the customer circuitry will be connected is identified 64.

Thus, it can be seen that according to one aspect of the invention, pseudo-pin inputs may be substituted into the core netlist for at least some of the circuitry, for example the JTAG Interface circuitry of FIGS. 1 and 2. With this substitution, an abbreviated core netlist of the vendor circuit that includes the pseudo pins and the output node is generated 66. The abbreviated netlist is then delivered to the customer to enable the customer to develop and append its own custom circuit to the embedded vendor circuit.

During the second phase of circuit development, the customer develops its own circuit 68 in the form of a customer netlist. The customer netlist is appended or attached to said abbreviated core netlist with substituted pseudo-pins to produce an abbreviated total circuit 70. The ATPG software is then applied to the abbreviated total circuit to produce a number of circuit test vectors 72. Thereafter, references to the pseudo-pin inputs are removed from the total circuit 74 and the removed original circuitry is substituted back thereinto 76. Finally, the test vectors are applied to the original circuitry.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

The invention claimed is:

1. A process for testing a circuit having both a vendor embedded circuit core and appended user circuitry, using ATPG software to generate test vectors therefore, comprising:
   A. generating a partial netlist of the entire vendor circuit;
   B. define at least one pseudo-pin input for at least some of the circuitry in the partial netlist;
   C. identify an output node of the vendor circuit to which the user circuitry will be connected;
   D. generate an abbreviated core netlist of the vendor circuit that includes the pseudo-pin input and the output node to produce outputs at the output node in response to an input.

2. The process of claim 1 in which the pseudo-pins are substituted into the core netlist for at least some of the circuitry.

* * * * *